(12) United States Patent
Chang et al.

(10) Patent No.: US 10,868,222 B2
(45) Date of Patent: Dec. 15, 2020

(54) METHOD OF MANUFACTURING GALLIUM NITRIDE QUANTUM DOTS

(71) Applicants: LG Display Co., Ltd., Seoul (KR); Korea University Research and Business Foundation, Seoul (KR)

(72) Inventors: Kiseok Chang, Paju-si (KR); Kwang Seob Jeong, Seoul (KR); Yunchang Choi, Anyang-si (KR); Jihwan Jung, Seoul (KR); JeongMin Moon, Goyang-si (KR); SoonShin Jung, Paju-si (KR)

(73) Assignees: LG Display Co., Ltd., Seoul (KR); Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/661,938

(22) Filed: Oct. 23, 2019

(65) Prior Publication Data
US 2020/0168768 A1    May 28, 2020

Related U.S. Application Data

(60) Provisional application No. 62/770,747, filed on Nov. 22, 2018.

(51) Int. Cl.
| | |
|---|---|
| *H01L 33/50* | (2010.01) |
| *C09K 11/62* | (2006.01) |
| *B82Y 40/00* | (2011.01) |
| *B82Y 20/00* | (2011.01) |
| *H01L 21/02* | (2006.01) |

(52) U.S. Cl.
CPC ............ *H01L 33/502* (2013.01); *C09K 11/62* (2013.01); *B82Y 20/00* (2013.01); *B82Y 40/00* (2013.01); *H01L 21/0254* (2013.01); *H01L 21/02601* (2013.01); *H01L 2933/0041* (2013.01)

(58) Field of Classification Search
CPC .............. H01L 33/502; H01L 21/0254; H01L 21/02601; H01L 21/02603; H01L 2933/0041; B82Y 40/00; B82Y 20/00; C09K 11/62
See application file for complete search history.

(56) References Cited

U.S. PATENT DOCUMENTS

| | | | |
|---|---|---|---|
| 9,853,190 B2 * | 12/2017 | Glarvey | ................... B01J 13/02 |
| 2010/0159248 A1 * | 6/2010 | Jang | ........................ C09K 11/70 |
| | | | 428/403 |
| 2011/0227007 A1 * | 9/2011 | Kang | ................ H01L 21/02557 |
| | | | 252/519.51 |

(Continued)

Primary Examiner — Michael M Trinh
(74) Attorney, Agent, or Firm — Fenwick & West LLP

(57) ABSTRACT

Provided is a method of manufacturing gallium nitride quantum dots. The method includes the steps of: preparing a gallium precursor solution by heating a mixture prepared by dissolving a gallium halide and an organic ligand in a solvent; heating the gallium precursor solution to obtain a heated gallium precursor solution; hot-injecting a nitrogen precursor into the heated gallium precursor solution at a heating temperature to produce gallium nitride; growing the gallium nitride while maintaining the heating temperature, thereby producing a growth-completed gallium nitride; and cooling a solution including the growth-completed gallium nitride to produce gallium nitride quantum dots in a colloid state.

12 Claims, 9 Drawing Sheets

(56) References Cited

U.S. PATENT DOCUMENTS

| | | | |
|---|---|---|---|
| 2012/0025146 A1* | 2/2012 | Taylor | H01L 33/26 252/501.1 |
| 2013/0186326 A1* | 7/2013 | Feigelson | C30B 9/00 117/75 |
| 2014/0361228 A1* | 12/2014 | Jang | C30B 29/60 252/519.4 |
| 2017/0037314 A1* | 2/2017 | Nam | C09K 11/54 |
| 2017/0355903 A1* | 12/2017 | Kazama | C30B 29/403 |

* cited by examiner

METHOD OF MANUFACTURING GALLIUM NITRIDE QUANTUM DOTS

CROSS-REFERENCE TO RELATED APPLICATIONS

This application claims priority to U.S. Provisional Application No. 62/770,747 filed on Nov. 22, 2018, in the United States Patents and Trademark Office, the disclosure of which is incorporated herein in its entirety.

BACKGROUND

Field

The present disclosure relates to a method of manufacturing gallium nitride quantum dots, and more particularly, to a method of manufacturing gallium nitride quantum dots which is capable of manufacturing the gallium nitride quantum dots at low temperatures within a short time by using low priced raw materials.

Description of the Related Art

Quantum dots, as semiconductor nanocrystals with a size of several to several tens of nanometers, have a high color index and excellent light stability compared to organic materials, have a wide absorption wavelength range, and are particularly characterized in that the quantum dots facilitate adjusting of a band gap to enable easily adjusting a wavelength band of emitted light. Such optical characteristics of the quantum dots are based on a quantum confinement effect, and this means a phenomenon that an energy band gap of the material is increased when a size of material is reduced to an intrinsic Bohr exciton radius or less. Namely, provided is an advantage that the quantum dots enable a broader range of applications to various elements since light emitting properties can be diversely adjusted while a light-emitting wavelength band is changed by the quantum confinement effect when particle sizes of the quantum dots are adjusted.

Quantum dots that have currently universally been used are cadmium-based quantum dots such as cadmium selenide (CdSe) and cadmium sulfide (CdS). The cadmium-based quantum dots have widely been used in the field of displays since the cadmium-based quantum dots have high color reproducibility and an advantage that high luminescence intensity can be realized even with a small amount. However, the cadmium-based quantum dots include cadmium that is an environmentally harmful material and is toxic to the human body. Accordingly, indium phosphide (InP) quantum dots, gallium nitride (GaN) quantum dots and others which are formed of Group III elements (Al, In, Ga, etc.) and Group V elements (N, P, etc.) as cadmium-free quantum dots have been suggested. The gallium nitride quantum dots have a broad band gap, facilitate adjustment of the band gap through alloys with other metal elements, can be operated from an ultraviolet range to a visible light range, and have excellent electron mobility and thermal conductivity. Therefore, the gallium nitride quantum dots have widely been used as ultraviolet light emitting elements and optoelectronic elements including a blue light emitting diode and others.

SUMMARY

In present, the gallium nitride quantum dots have been manufactured by a chemical vapor deposition (CVD) method of vapor depositing a organometallic compound on a substrate by using an organometallic compound as a source or by using a molecular-beam epitaxy (MBE) method that is a method of scraping the thin film after forming a thin film on the substrate by the CVD method. However, the CVD method requires high costs to secure operational stability as the CVD method is performed under a toxic ammonia gas atmosphere. On the other hand, the MBE method does not exhibit intrinsic optical properties of the quantum dots as described above since it is not easy to adjust particle sizes and distribution of the particle sizes. Above all, these two methods have high production costs since they have great equipment dependence. Accordingly, there has been a problem that it is difficult to apply the two methods for commercial use.

Therefore, methods of manufacturing gallium nitride quantum dots through an inexpensive solution process have been suggested. A solution processing method of manufacturing gallium nitride quantum dots by making gallium(III) chloride ($GaCl_3$) react with dimethylaminolithium (LiN$(CH_3)_2$) to produce dimeric amidogallium ($\{Ga(NH)_{3/2}\}_n$), and then pyrolyzing dimeric amidogallium at high temperatures for a long time has been suggested. A solution processing method of manufacturing the gallium nitride quantum dots by making gallium(III) chloride react with tris(N-nitroso-N-phenylhydroxylaminato) ammonium to produce gallium cupferron, and making gallium cupferron react with bis(trimethylsilyl)amide in a pressurization reactor has also been suggested.

In case of the former method of the above-described solution processing methods, disadvantages include a time of 24 hours or more required for each of processes of producing and pyrolyzing a gallium precursor, high costs of energy consumption in the process as the pyrolysis process is performed at a high temperature of 360° C. or higher under an ammonia gas atmosphere, and high costs required to secure stability of an operator using a toxic gas. Further, since such manufactured quantum dots are absent from a ligand capable of preventing agglomeration of the quantum dots, a separate postprocess of introducing an organic ligand is required such that utilization of the former method is industrially lowered.

In case of the latter method of the above-described solution processing methods, it is difficult to mass produce quantum dotes using this process since a pressurization reactor is used, and, although it is restrictively possible to adjust the quantum confinement effect, a change in physical properties including a light-emitting energy accompanied when adjusting the quantum confinement effect is inadequate. Accordingly, commercial and industrial application of the latter method has also been difficult.

Further, it has been difficult to apply the above solution processing methods since it has been difficult to adjust the quantum confinement effect using a top-down method of pulverizing the organic cluster by pyrolyzing the organic cluster at high temperatures after producing an organic cluster including gallium nitride by reacting a gallium precursor under a gas of a high risk group such as ammonia.

Therefore, a method of manufacturing gallium nitride quantum dots is disclosed, which can manufacture the quantum dots at a relatively low temperature within a short time, can be applied to an existing solution process-based quantum dot manufacturing system without facility or design modifications, and does not require a separate postprocess for preventing agglomeration of the quantum dots when manufacturing the gallium nitride quantum dots by an inexpensive solution process.

Accordingly, it is an objective of the present disclosure to provide a method of manufacturing gallium nitride quantum dots, the method which can effectively adjust light-absorbing and light-emitting energies of the quantum dots by manufacturing the gallium nitride quantum dots in a bottom-up method of synthesizing gallium nitride using a precursor material of a molecular unit and gradually growing gallium nitride from a small size, and easily adjusting the quantum confinement effect.

Another objective of the present disclosure is to provide a method of manufacturing gallium nitride quantum dots, the method which can manufacture the quantum dots at low temperatures within a short time by using low priced raw materials, and has excellent operation stability since an ammonia gas that is a toxic material is not required.

Further, the existing conventional solution process methods have a disadvantage of requiring a complicated process and a long process time involving synthesizing a gallium precursor for a long time to obtain a synthesized gallium precursor, separating and purifying the synthesized gallium precursor to obtain a gallium precursor, and making the gallium precursor react with a nitrogen precursor in a separate reactor.

Therefore, since a process of separating and purifying the synthesized gallium precursor is not required in the disclosed method after synthesizing the gallium precursor, the disclosed method of manufacturing gallium nitride quantum dots is simple and efficient compared to conventional methods.

Objects of the present disclosure are not limited to the above-mentioned objects, and other objects, which are not mentioned above, can be clearly understood by those skilled in the art from the following descriptions.

In order to achieve the above-described objectives, a method of manufacturing gallium nitride quantum dots according to an embodiment of the present disclosure includes the steps of: preparing a gallium precursor solution by heating a mixture prepared by dissolving a gallium halide and an organic ligand in a solvent; heating the gallium precursor solution to obtain a heated gallium precursor solution; hot-injecting a nitrogen precursor into the heated gallium precursor solution at a heating temperature to produce gallium nitride; growing gallium nitride while maintaining the heating temperature, thereby producing a growth-completed gallium nitride; and cooling a solution including the growth-completed gallium nitride to produce gallium nitride quantum dots in a colloid state.

Other details of the exemplary embodiments are included in the detailed description and the drawings.

The method according to the present disclosure provides advantages of enabling energy costs required in a manufacturing process to be effectively reduced and greatly shortening the process time by producing gallium nitride quantum dots in a colloid state at a relatively low temperature within a short time using low priced raw materials.

The method according to the present disclosure provides an advantage of excellent operation stability since ammonia is not used in the manufacturing process.

The method according to the present disclosure can greatly reduce the process time and costs since the method does not require a process of separating and purifying the synthesized gallium precursor after synthesizing a gallium precursor to obtain a synthesized gallium precursor or a postprocess of imparting an organic ligand to the quantum dots to prevent agglomeration of the manufactured quantum dots.

The method according to the present disclosure can be used to easily adjust the quantum confinement effect and can effectively adjust the light-absorbing and light-emitting energies of the quantum dots accordingly.

The effects according to the present disclosure are not limited to the contents exemplified above, and more various effects are included in the present specification.

BRIEF DESCRIPTION OF THE DRAWINGS

The above and other aspects, features, and other advantages of the present disclosure will be more clearly understood from the following detailed description taken in conjunction with the accompanying drawings.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein, and may be implemented in various forms. The exemplary embodiments are provided by way of example only so that those skilled in the art can fully understand the disclosures of the present disclosure and the scope of the present disclosure. Therefore, the present disclosure will be defined only by the scope of the claims.

The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to the accompanying drawings.

Figure 1:
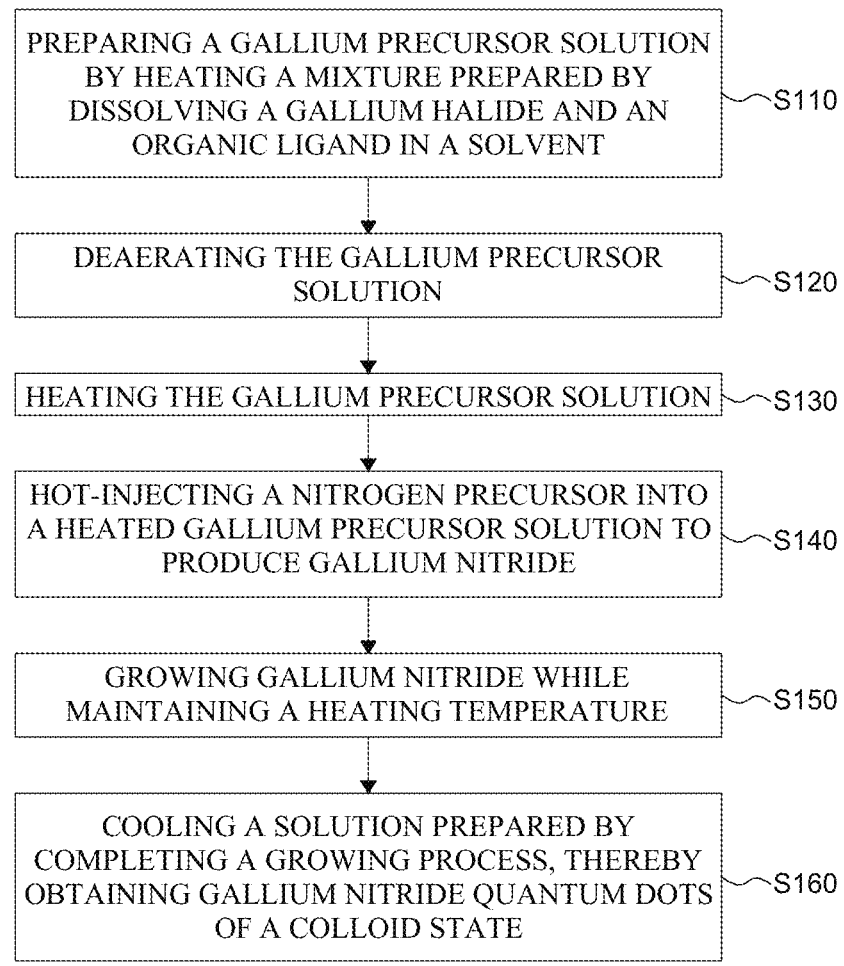
FIG. 1 is a flowchart for explaining a method of manufacturing gallium nitride quantum dots, according to an embodiment of the present disclosure.
Figure 2:
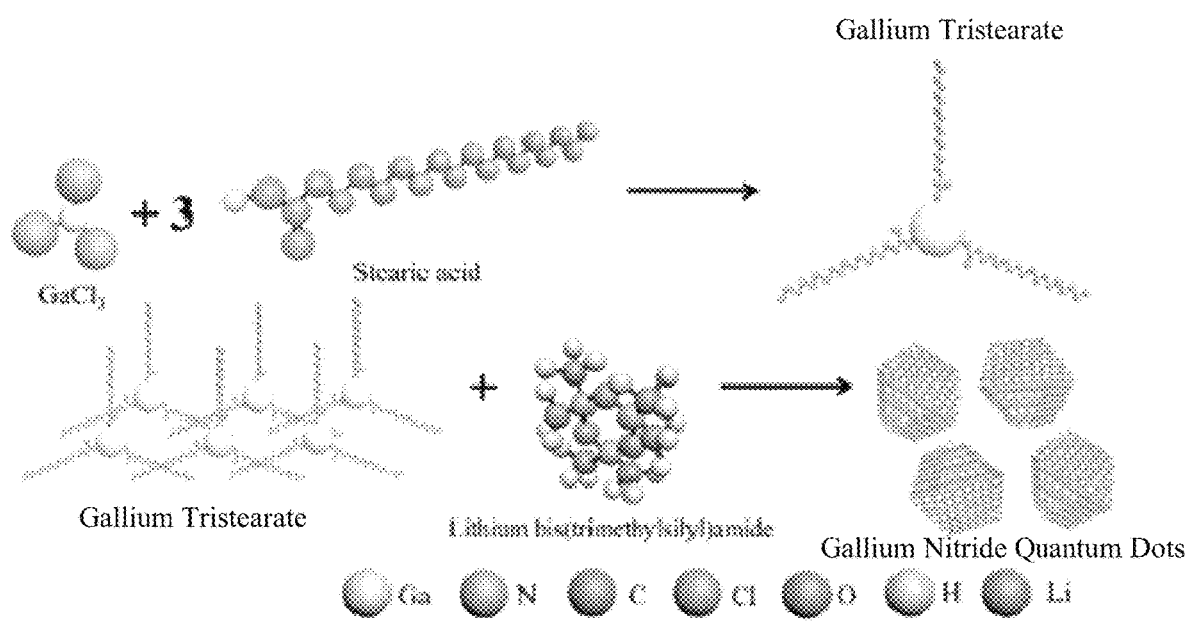
FIG. 2 is a schematic diagram illustrating a process of synthesizing gallium nitride quantum dots, according to an embodiment of the present disclosure.

FIG. 1 is a flowchart for explaining a method of manufacturing gallium nitride quantum dots according to an embodiment of the present disclosure. FIG. 2 is a schematic diagram illustrating a process of synthesizing gallium nitride quantum dots according to an embodiment of the present disclosure.

Referring to FIG. 1 and FIG. 2, a method of manufacturing gallium nitride quantum dots according to an embodiment of the present disclosure includes a step (S110) of preparing a gallium precursor solution by heating a mixture prepared by dissolving a gallium halide and an organic ligand in a solvent, a step (S120) of deaerating the gallium precursor solution, a step (S130) of heating the gallium precursor solution, a step (S140) of hot-injecting a nitrogen precursor into a heated gallium precursor solution to produce gallium nitride, a step (S150) of growing gallium nitride while maintaining a heated temperature, and a step (S160) of cooling a solution including a growth-completed gallium nitride to produce gallium nitride quantum dots in a colloid state. Hereinafter, a method of manufacturing gallium nitride quantum dots according to the present disclosure will be described more in detail with reference to FIG. 1 and FIG. 2.

First, the method includes the step (S110) of preparing a gallium precursor solution by heating a mixture prepared by dissolving a gallium halide and an organic ligand in a solvent.

For example, the gallium halide may be one or more selected from gallium chloride and gallium fluoride, preferably gallium chloride.

The organic ligand enables quantum dots with uniform size distribution to be obtained by enabling gallium nitride quantum dots to be well dispersed in a solution without agglomerating the gallium nitride quantum dots. Light emitting properties of the quantum dots may be varied depending on types of the organic ligand. For example, the organic ligand may be one or more selected from stearic acid, oleic acid, palmitic acid, linolenic acid, myristic acid, lauric acid, octadecylamine, oleylamine, n-octylamine, hexadecylamine, dodecylamine, trioctylphosphine oxide, and trihexylphosphine oxide. Preferably, the organic ligand may be stearic acid. Quantum dots of a final colloid state have excellent dispersion stability since stearic acid has a high reactivity and sufficiently covers surfaces of the quantum dots when using stearic acid as the organic ligand. Further, when the surfaces of the quantum dots are not sufficiently covered, since a difference between an absorption wavelength band and an emission wavelength band may be small in gallium nitride quantum dots, light emitted from a quantum dot may be absorbed into an adjacent other quantum dot such that light emitting efficiency may be lowered. However, the gallium nitride quantum dots have excellent light emitting efficiency when sufficient dispersion stability is achieved when using stearic acid as the organic ligand.

Referring to FIG. 2, gallium tristearate as a gallium precursor can be produced using gallium chloride as a gallium halide and stearic acid as an organic ligand in an embodiment of the present disclosure.

The gallium halide and the organic ligand can be directly injected into a reactor having a solvent prepared therein. Further, after preparing a gallium halide solution and an organic ligand solution respectively by dissolving the gallium halide and the organic ligand in a solvent, the gallium halide solution and the organic ligand solution can be injected into the reactor. In this case, reaction efficiency can be improved since the gallium halide and the organic ligand are more uniformly mixed in the solvent.

The gallium halide and the organic ligand can be simultaneously or sequentially injected into the reactor such that the gallium halide and the organic ligand can be dissolved in the solvent.

If the solvent can dissolve the organic ligand, the solvent is not particularly limited. For example, the solvent may be a $C_6$ to $C_{40}$ aliphatic hydrocarbon. Although specific examples of the solvent may include one or more selected from hexadecane, octadecane, 1-octadecene, hexane, octane, and squalane, the specific examples of the solvent are not limited thereto.

The gallium halide and the organic ligand may be injected in a molar ratio range of 1:2 to 1:4, and quantum dots have excellent dispersion stability and light emitting properties within this range. The quantum confinement effect may be weakened since the quantum dots are not evenly dispersed, but are agglomerated when the number of moles of the organic ligand with respect to 1 mole of the gallium halide is less than the range, while an applicable light-emitting wavelength band may be limited since a ratio of quantum dots with a relatively small particle size is high when the number of moles of the organic ligand is greater than the range.

The step (S110) may be performed, for example, at a temperature in a range of 80° C. to 120° C. for a duration in a range of 1 to 3 hours. In an embodiment, the step (S11) is performed at a temperature in a range of 90° C. to 100° C. for 2 to 3 hours.

The gallium precursor solution is directly used in a process of the next step without passing through a process of separately separating, washing or purifying the gallium precursor. The present disclosure enables an one-pot process in which processes of production of the gallium precursor to acquisition of the gallium nitride quantum dots are carried out within the reactor, and ultimately provides an effect of reducing process time and costs by directly using such prepared gallium precursor solution in the next process steps without performing a separate purification treatment.

Further, the method includes a step (S120) of deaerating the gallium precursor solution.

The deaeration process may be performed by conventional deaeration method, but the deaeration process is not limited to such methods. For example, the deaeration process may be conducted using a vacuum pump or a decompression pump. Water and oxygen within the reactor are removed by deaerating the gallium precursor solution. After performing the deaeration process, air within the reactor may be replaced with an inert gas such as nitrogen, or argon.

Further, the method includes a step (S130) of heating the gallium precursor solution.

The gallium precursor solution is heated to a temperature in a range of 200° C. to 280° C. In the step (S130), when the heating temperature is less than 200° C., manufacturing efficiency of quantum dots may be lowered since a reaction time is lengthened. When the heating temperature is more than 280° C., purity of final gallium nitride quantum dots may be lowered since a side reaction may occur.

The step (S130) may be performed in an atmosphere of an inert gas such as nitrogen, or argon.

Further, the method includes a step (S140) of hot-injecting a nitrogen precursor into a heated gallium precursor solution to produce gallium nitride.

In the step (S140), the nitrogen precursor is hot-injected into the gallium precursor solution at a temperature in a range of 200° C. to 280° C. under an inert gas atmosphere. In the step (S140), reaction efficiency may be lowered with a hot-injection process when the temperature is less than 200° C. When the temperature is more than 280° C., it is difficult to control reaction, and a side reaction is caused such that purity of final gallium nitride quantum dots may be lowered, although reaction rate may be improved.

In the step (S140), it is preferable to prevent oxygen or water from being introduced in the gallium precursor solution since, when oxygen or water is introduced in the gallium precursor solution during injection of the nitrogen precursor, an oxidation reaction of the gallium precursor may occur at high temperatures, and purity of the gallium nitride quantum dots is lowered accordingly such that light emitting efficiency may be lowered. From this point of view, the step (S140) is preferably performed under an atmosphere of an inert gas such as nitrogen, or argon.

It is preferable that the nitrogen precursor is quickly hot-injected into the gallium precursor solution at a time.

The nitrogen precursor may be, for example, a compound represented by the following chemical formula 1:

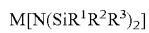

$M[N(SiR^1R^2R^3)_2]$ (Chemical Formula 1)

In chemical formula 1, M is selected from Group 1 elements on the periodic table of elements, and $R^1$, $R^2$ and $R^3$ may be the same as or different from each other, and are each independently selected from $C_1$ to $C_3$ alkyl groups.

As a specific example, the nitrogen precursor may be lithium bis(trimethylsilyl)amide in which M is lithium (Li), and all of $R^1$, $R^2$ and $R^3$ are a methyl group in chemical formula 1. When using lithium bis(trimethylsilyl)amide as the nitrogen precursor, there are advantages that reactivity is excellent, and it is easy to control a reaction process.

Referring to FIG. 2, gallium nitride is produced by making gallium tristearate, i.e. a gallium precursor produced according to an embodiment of the present disclosure, react with lithium bis(trimethylsilyl)amide, i.e. an example of the nitrogen precursor.

Although the nitrogen precursor may be directly hot-injected into the gallium precursor solution in a solid state without separate physical or chemical treatment of the nitrogen precursor, it is preferable to hot-inject the nitrogen precursor solution into the gallium precursor solution after preparing a nitrogen precursor solution by dissolving the nitrogen precursor in a solvent in advance. At this time, although examples of the solvent may include one or more selected from hexane, octadecene, and squalane, the examples of the solvent are not limited thereto.

In the step (S140), the nitrogen precursor is injected such that a molar ratio of the gallium precursor to the nitrogen precursor becomes a ratio in a range of 1:2 to 1:4. Reaction balance is excellent within the range.

Further, the method includes a step (S150) of growing gallium nitride while maintaining a heated temperature.

The step (S150) is performed at a temperature in a range of 200° C. to 280° C. for a duration in a range of 5 minutes to 4 hours under an inert gas atmosphere. At this time, process efficiency may be lowered when the temperature is less than 200° C., since reaction rate is slow. When the temperature is more than 280° C., particle distribution may be increased since the reaction rate is faster, but a side reaction may be caused, and coarsening of particles may occur. As the temperature is increased within the above temperature range, light emission wavelengths of quantum dots produced exhibit a red shift. Namely, as the temperature is increased, a peak light emission wavelength of the quantum dots is moved to a longer wavelength. For example, gallium nitride quantum dots produced by performing the step (S150) under conditions including a temperature of 220° C. and a reaction time of 10 minutes according to an embodiment of the present disclosure have a peak light emission wavelength of 315 nm, and gallium nitride quantum dots obtained by performing the step (S150) under a temperature condition of 280° C. with otherwise the same conditions exhibit a red shift and have a peak light emission wavelength of 330 nm.

The step (S150) is performed for 5 minutes to 4 hours, preferably 10 minutes to 3 hours. At this time, growth time of gallium nitride is not sufficient when the step (S150) is performed for less than 5 minutes, while the quantum confinement effect may be lowered when the step (S150) is performed for more than 4 hours since a quantum confinement effect is not adjusted due to little change in absorption and light emitting wavelengths, and coarsening of the particles may occur due to agglomeration between particles. As the growth time is increased within the range, light emission wavelengths of quantum dots produced exhibit a red shift.

Further, the method includes a step (S160) of cooling a solution including a growth-completed gallium nitride to produce gallium nitride quantum dots in a colloid state.

The step (S160) may include cooling the solution to room temperature by removing a heating source, according to an embodiment.

The gallium nitride quantum dots are obtained in a state of a colloid dispersed in the solution. The gallium nitride quantum dots of the colloid state may be applied as a quantum dot coating film through a solution process such as spin coating, dip coating, or spray coating.

Hereinafter, the above-mentioned effects of the present disclosure will be described more in detail through Examples and Comparative Examples. However, the following Examples are only for illustration, and the scope of the present disclosure is not limited thereto.

Example 1

FIG. 2 is a schematic diagram illustrating a process of synthesizing gallium nitride quantum dots using the same raw materials as used in the following Example 1.

First, a mixture was prepared by dissolving 0.5 mmol of gallium(III) chloride ($GaCl_3$) and 1.5 mmol of stearic acid in 5 ml of 1-octadecene within a reactor. Gallium tristearate was synthesized by heating the mixture, thereby performing a reaction process at 100° C. for 2 hours. A solution including a synthesized gallium stearate was deaerated under a pressure of 200 mTorr. Next, the deaerated solution was heated to a temperature of 200° C. while maintaining an argon atmosphere by replacing the inside of the reactor with argon. After stabilizing the temperature of the reactor, 1.0 ml of a 1.5 M lithium bis(trimethylsilyl)amide-hexane solution prepared in a separate container was collected and quickly injected into the reactor at a temperature in a range of 250° C. to 280° C. After injecting lithium bis(trimethylsilyl)amide into the reactor, gallium nitride was grown at 200° C. for 10 minutes to obtain a product. Gallium nitride quantum dots in a colloid state were produced by removing a heating source, thereby cooling the product to room temperature.

Examples 2 to 8

Gallium nitride quantum dots in a colloid state were obtained by the same conditions and method as in Example 1 except with varying growth temperature and growth time as shown in the following Table 1.

TABLE 1

|  | Ex. 1 | Ex. 2 | Ex. 3 | Ex. 4 | Ex. 5 | Ex. 6 | Ex. 7 | Ex. 8 |
| --- | --- | --- | --- | --- | --- | --- | --- | --- |
| Growth temperature [° C.] | 200 | 220 | 240 | 280 | 280 | 280 | 280 | 280 |
| Growth time [min] | 10 | 10 | 10 | 10 | 60 | 90 | 120 | 180 |

Absorption Spectrum and Photoluminescence Spectrum

Figure 3A:
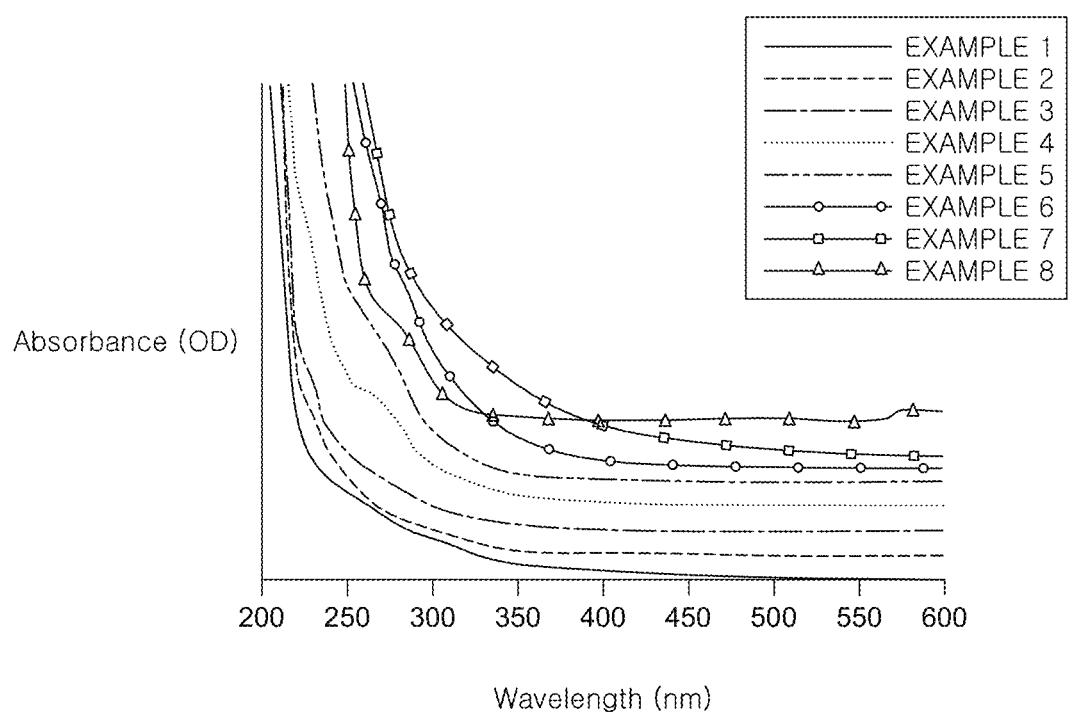
FIG. 3A is an UV-visible absorption spectrum of gallium nitride quantum dots synthesized with varied growth temperature and time, according to an embodiment of the present disclosure.

Absorption and light emitting properties according to growth temperature and time during manufacturing of gallium nitride quantum dots were analyzed. Specifically, UV-visible absorption spectrums and photoluminescence (PL) spectrums of gallium nitride quantum dots in a colloid state according to Examples 1 to 8 were measured. FIG. 3A is an UV-visible absorption spectrum of gallium nitride quantum dots in a colloid state synthesized with varying growth temperature and time, according to some embodiments, and FIG. 3B is a photoluminescence (PL) spectrum of the gallium nitride quantum dots.

Figure 3B:
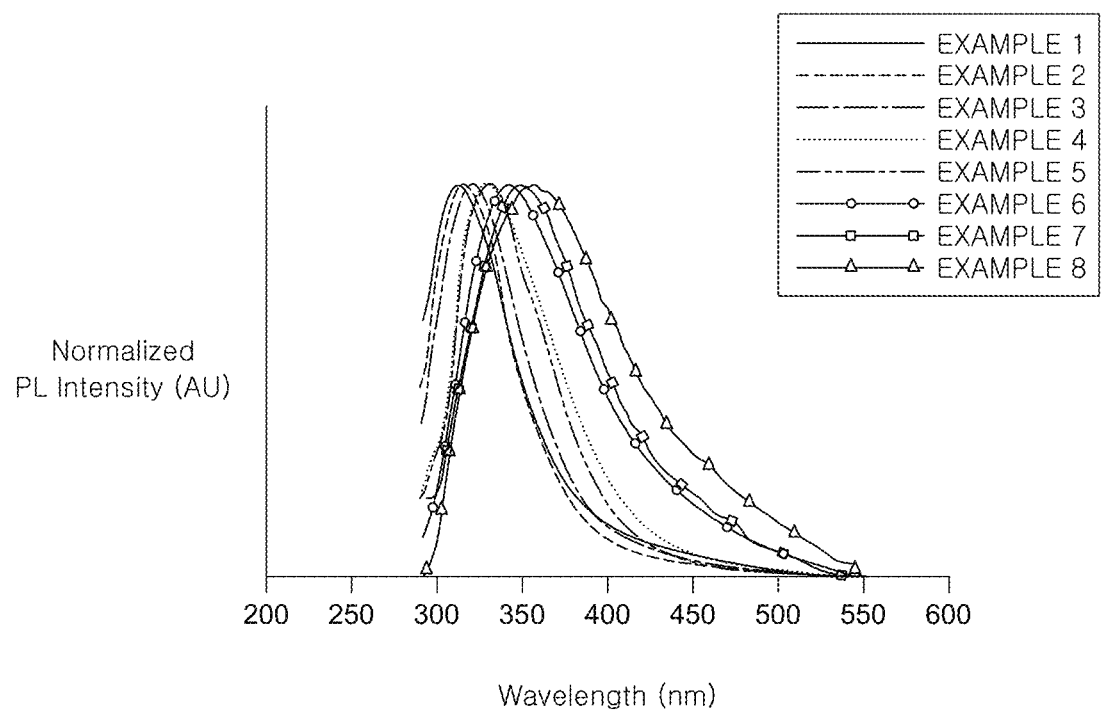
FIG. 3B is a photoluminescence (PL) spectrum of gallium nitride quantum dots synthesized with varied growth temperature and time, according to an embodiment of the present disclosure.

Referring to FIG. 3A and FIG. 3B, it is shown that the absorption and light emitting properties of the quantum dots are varied depending on the growth temperature and time. Particularly, it is shown in FIG. 3B that peak PL wavelengths of gallium nitride quantum dots according to Examples 1 to 8 are red-shifted as the growth time and a reaction temperature are increased. Specifically, referring to Examples 1 to 4, peak PL wavelengths of gallium nitride quantum dots are increased as the growth temperature is increased from 200° C. to 280° C. Further, referring to Examples 4 to 8, peak PL wavelengths of gallium nitride quantum dots are increased as the growth time is increased from 10 minutes to 180 minutes. For example, the peak PL wavelengths increased from 310 nm to 360 nm as the growth temperature and the growth time increased.

Further, it can be confirmed that full-widths at half maximum (fwhm) in the PL spectrums widened as the growth time of quantum dots increased, as a result of an ostwald ripening effect of dissolving relatively small-sized particles in a reaction system while the growth time is increased and attaching dissolved, relatively small-sized particles to surfaces of relatively large-sized particles, thereby increasing particle size distribution.

Further, gallium nitride quantum dots synthesized according to Examples 1 to 8 are observed having peak PL wavelengths shorter than a band gap wavelength 365 nm of bulk gallium nitride, confirming that the gallium nitride quantum dots manufactured according to the present disclosure exhibit the quantum confinement effect.

Further, it is difficult, using conventional solution processing manufacturing methods, to adjust the quantum confinement effect of gallium nitride quantum dots by adjusting the reaction conditions. It is shown, according to the method of the present disclosure, that sizes of the quantum dots can be adjusted by a simple method of adjusting the growth temperature and time, and a commercially favorable advantage is provided by facilitating adjustment of the quantum confinement effect as confirmed in FIG. 3A and FIG. 3B.

XRD Analyses and TEM Analyses

Figure 4A:
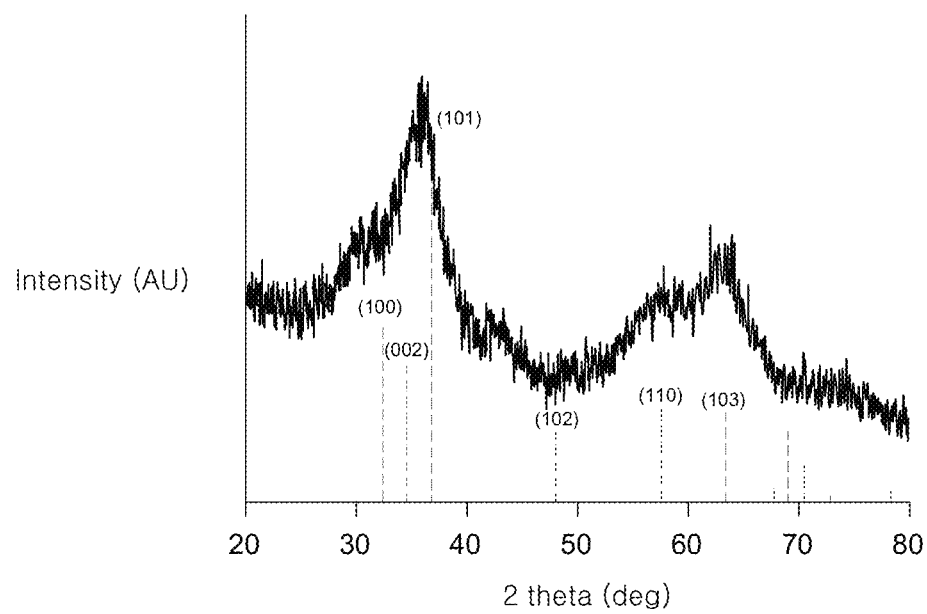
FIG. 4A is an X-ray diffraction (XRD) spectrum of gallium nitride quantum dots synthesized according to an embodiment of the present disclosure.
Figure 4B:
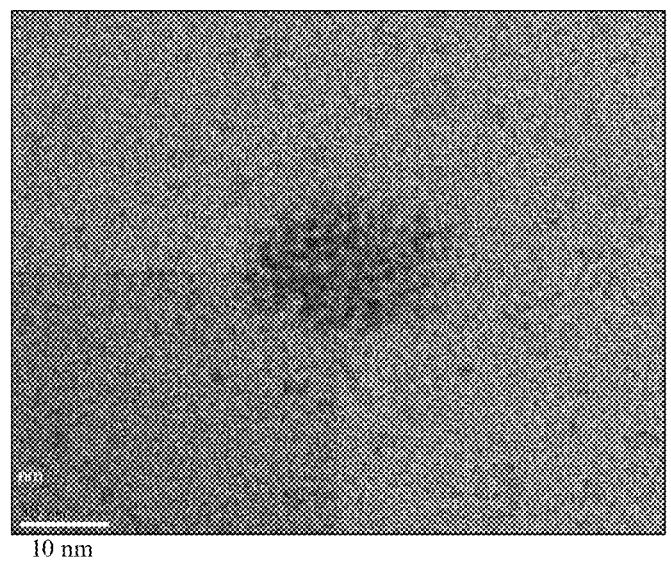
FIG. 4B is a transmission electron microscope (TEM) photograph of gallium nitride quantum dots synthesized according to an embodiment of the present disclosure.

X-ray diffraction analyses (XRD) and transmission electron microscope (TEM) analyses of gallium nitride quantum dots synthesized according to the above-mentioned Examples were conducted. FIG. 4A shows X-ray diffraction (XRD) spectrums of gallium nitride quantum dots synthesized according to Examples, and FIG. 4B is a transmission electron microscope (TEM) photograph of gallium nitride quantum dots synthesized according to an embodiment. The XRD spectrum of FIG. 4A confirms that gallium nitride quantum dots synthesized according to an embodiment of the present disclosure have a wurtzite structure, and it can be confirmed by referring to FIG. 4B that the quantum dots have a size of about 3 nm.

XPS Analyses

Figure 5A:
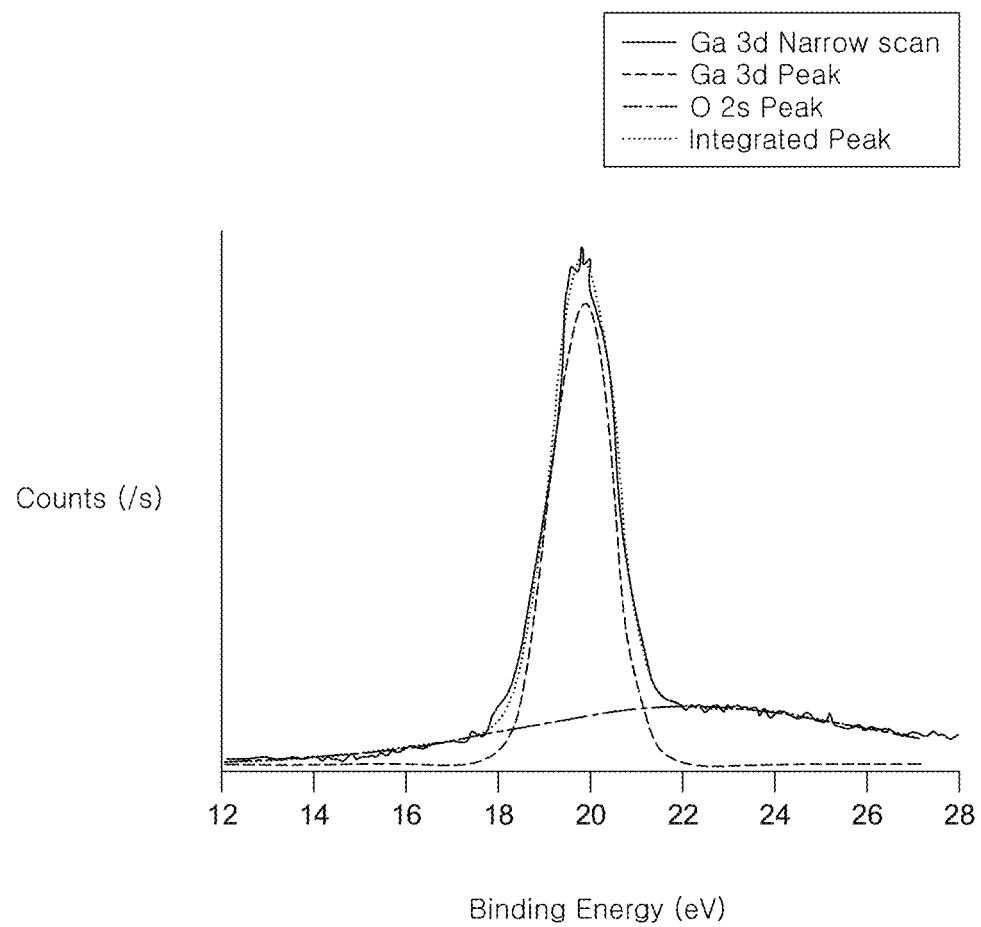
FIG. 5A is an X-ray photoelectron spectroscopy (XPS) spectrum with respect to a Ga 3d region of gallium nitride quantum dots synthesized according to an embodiment of the present disclosure.
Figure 5B:
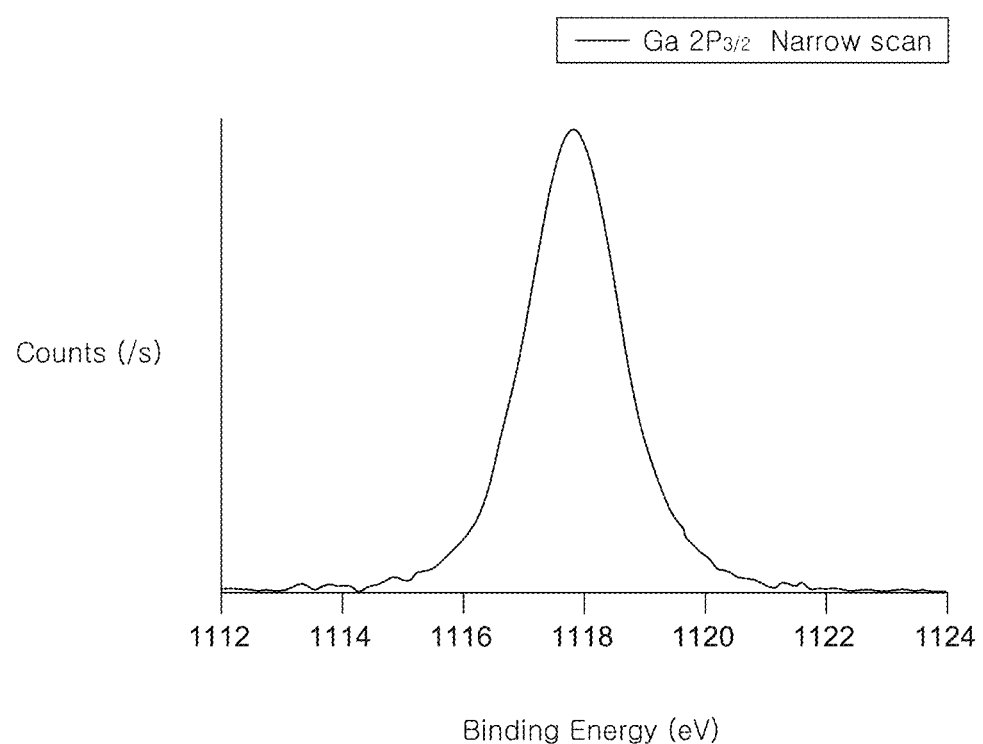
FIG. 5B is an XPS spectrum with respect to a Ga $2P_{3/2}$ region of gallium nitride quantum dots synthesized according to an embodiment of the present disclosure.
Figure 5C:
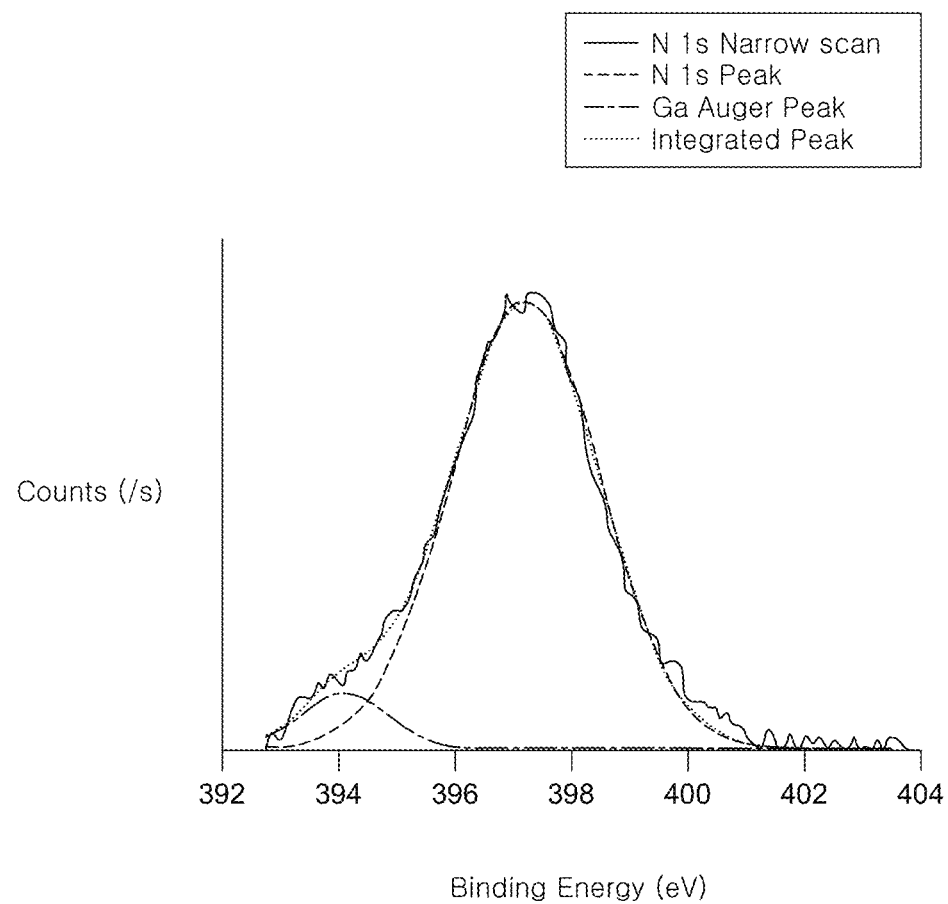
FIG. 5C is an XPS spectrum with respect to an N is region of gallium nitride quantum dots synthesized according to an embodiment of the present disclosure.

X-ray photoelectron spectroscopy (XPS) analyses were conducted to analyze chemical compositions of gallium nitride quantum dots synthesized according to the Examples, and results of the XPS analyses are illustrated in FIG. 5A to FIG. 5C. FIG. 5A is an XPS spectrum with respect to a Ga 3d region of gallium nitride quantum dots manufactured according to an embodiment of the present disclosure, FIG. 5B is an XPS spectrum with respect to a Ga $2P_{3/2}$ region, and FIG. 5C is an XPS spectrum with respect to an N 1s region.

It is shown in FIG. 5A and FIG. 5B that gallium of gallium nitride quantum dots synthesized according to Examples have a binding energy of 19.78 eV in a 3d electron energy region and have a binding energy of 1,117.78 eV in a $2P_{3/2}$ electron energy region. Further, it is shown in FIG. 5C that nitrogen of the gallium nitride quantum dots has a binding energy of 397.2 eV in a 1s electron energy region. It can be confirmed from this that nitrogen atoms of the gallium nitride are not caused by a nitrogen precursor used in the reaction, but are caused by nitrogen of a gallium nitride crystal component. This is a value corresponding to gallium nitride of a wurtzite structure synthesized by a conventionally-known chemical vapor deposition method.

Further, although it has been known that a binding energy of gallium is increased when oxygen exists in gallium nitride, it can be confirmed that gallium nitride synthesized according to the present disclosure does not have an intermediate binding energy value of gallium atoms of gallium nitride and gallium oxide, and has a very high purity accordingly.

A method of manufacturing gallium nitride quantum dots according to Examples of the present disclosure can greatly contribute to shortening of process time and reduction of energy costs compared to conventional solution processing methods by enabling gallium nitride quantum dots to be obtained at a relatively low temperature within a short time and enabling an one-pot process to be performed. Further, the method has very high industrial usability by adjusting the growth time and temperature when manufacturing quantum dots, thereby enabling absorption and light emitting wavelengths of the quantum dots obtained to be easily adjusted.

The exemplary embodiments of the present disclosure can also be described as follows:

According to an aspect of the present disclosure, there is provided a method of manufacturing gallium nitride quantum dots. The method comprising the steps of: preparing a gallium precursor solution by heating a mixture prepared by dissolving a gallium halide and an organic ligand in a solvent, heating the gallium precursor solution to obtain a heated gallium precursor solution, hot-injecting a nitrogen precursor into the heated gallium precursor solution to produce gallium nitride, growing the gallium nitride while maintaining the heated temperature, thereby producing a growth-completed gallium nitride, and cooling a solution including the growth-completed gallium nitride to produce gallium nitride quantum dots in a colloid state.

The gallium nitride quantum dots of the colloid state may be manufactured by an one-pot process.

The gallium halide may include one or more selected from gallium chloride and gallium fluoride.

The organic ligand may include one or more selected from stearic acid, oleic acid, palmitic acid, linolenic acid, myristic acid, lauric acid, octadecylamine, oleylamine, n-octylamine, hexadecylamine, dodecylamine, trioctylphosphine oxide, and trihexylphosphine oxide.

The step of preparing the gallium precursor solution may be performed at 80° C. to 120° C. for 1 to 3 hours.

The method may further comprise the step of deaerating the gallium precursor solution between the step of preparing the gallium precursor solution and the step of heating the gallium precursor solution.

The step of heating the gallium precursor solution may comprise maintaining the temperature after heating the gallium precursor solution to a temperature of 200° C. to 280° C.

The nitrogen precursor may be a compound represented by the following chemical formula 1.

$$M[N(SiR^1R^2R^3)_2]$$ (Chemical Formula 1)

In chemical formula 1, M may be selected from Group 1 elements, and R1, R2, and R3 are each independently selected from C1 to C3 alkyl groups.

The step of producing gallium nitride may comprise hot-injecting the nitrogen precursor at a temperature of 200° C. to 280° C. under an inert gas atmosphere.

The step of growing gallium nitride may be performed at a temperature of 200° C. to 280° C. for 10 minutes to 3 hours under an inert gas atmosphere.

In the step of producing the gallium nitride, a molar ratio of the gallium precursor to the nitrogen precursor may be 1:2 to 1:4.

The step of growing gallium nitride may comprise the step of adjusting light-emitting wavelength region band of gallium nitride quantum dots obtained by adjusting reaction temperature, reaction time, or both thereof.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only, but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A method of manufacturing gallium nitride quantum dots comprising:
preparing a gallium precursor solution by heating a mixture prepared by dissolving a gallium halide and an organic ligand in a solvent;
heating the gallium precursor solution to obtain a heated gallium precursor solution;
hot-injecting a nitrogen precursor into the heated gallium precursor solution to produce gallium nitride;
growing the gallium nitride while maintaining a heating temperature, thereby producing a growth-completed gallium nitride; and
cooling a solution including the growth-completed gallium nitride to produce gallium nitride quantum dots in a colloid state.

2. The method of claim 1, wherein the gallium nitride quantum dots in the colloid state are manufactured by an one-pot process.

3. The method of claim 1, wherein the gallium halide includes one or more selected from gallium chloride and gallium fluoride.

4. The method of claim 1, wherein the organic ligand includes one or more selected from stearic acid, oleic acid, palmitic acid, linolenic acid, myristic acid, lauric acid, octadecylamine, oleylamine, n-octylamine, hexadecylamine, dodecylamine, trioctylphosphine oxide, and trihexylphosphine oxide.

5. The method of claim 1, wherein the preparing the gallium precursor solution is performed at a temperature in a range of 80° C. to 120° C. with a duration in a range of 1 to 3 hours.

6. The method of claim 1, further comprising deaerating the gallium precursor solution between the preparing the gallium precursor solution and the heating the gallium precursor solution.

7. The method of claim 1, wherein heating the gallium precursor solution comprises maintaining the heating temperature after heating the gallium precursor solution to a temperature in a range of 200° C. to 280° C.

8. The method of claim 1, wherein the nitrogen precursor is a compound represented by a chemical formula of $M[N(SiR^1R^2R^3)_2]$, wherein M is selected from Group 1 elements, and $R^1$, $R^2$ and $R^3$ are each independently selected from $C_1$ to $C_3$ alkyl groups.

9. The method of claim 1, wherein the hot-injecting the nitrogen precursor into the heated allium precursor solution to produce the gallium nitride comprises hot-injecting the nitrogen precursor at a temperature in a range of 200° C. to 280° C. in an inert gas atmosphere.

10. The method of claim 1, wherein the growing the gallium nitride is performed at a temperature in a range of 200° C. to 280° C. for a duration in a range of 10 minutes to 3 hours in an inert gas atmosphere.

11. The method of claim 1, wherein, a molar ratio of the gallium precursor to the nitrogen precursor is 1:2 to 1:4 to produce the gallium nitride.

12. The method of claim 1, wherein the growing the gallium nitride comprises adjusting a light emission wavelength band of the gallium nitride quantum dots by adjusting reaction temperature, reaction time, or both thereof.

* * * * *